United States Patent
Farooq et al.

(10) Patent No.: US 11,404,379 B2
(45) Date of Patent: Aug. 2, 2022

(54) STRUCTURE AND METHOD FOR BRIDGE CHIP ASSEMBLY WITH CAPILLARY UNDERFILL

(71) Applicant: International Business Machines Corporation, Armonk, NY (US)

(72) Inventors: Mukta Ghate Farooq, Hopewell Junction, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/950,332

(22) Filed: Nov. 17, 2020

(65) Prior Publication Data

US 2022/0157727 A1    May 19, 2022

(51) Int. Cl.
| | |
|---|---|
| H01L 23/00 | (2006.01) |
| H01L 23/538 | (2006.01) |
| H01L 25/065 | (2006.01) |
| H01L 21/56 | (2006.01) |
| H01L 25/00 | (2006.01) |
| H01L 23/31 | (2006.01) |

(52) U.S. Cl.
CPC ........ *H01L 23/5381* (2013.01); *H01L 21/563* (2013.01); *H01L 23/3157* (2013.01); *H01L 25/0655* (2013.01); *H01L 25/50* (2013.01)

(58) Field of Classification Search
CPC .............. H01L 23/5381; H01L 21/563; H01L 23/3157; H01L 25/0655; H01L 25/50
See application file for complete search history.

(56) References Cited

U.S. PATENT DOCUMENTS

| | | |
|---|---|---|
| 6,365,441 B1 | 4/2002 | Raiser et al. |
| 7,148,560 B2 | 12/2006 | Lee et al. |
| 9,330,946 B1 | 5/2016 | Farooq et al. |
| 9,373,559 B2 | 6/2016 | Brofman et al. |
| 9,503,622 B2 | 11/2016 | Jiang et al. |

(Continued)

FOREIGN PATENT DOCUMENTS

WO    2017111957 A1    6/2017

OTHER PUBLICATIONS

International Search Report and Written Opinion dated Feb. 14, 2022 issued in PCT/CN2021/129428, 9 pages.

*Primary Examiner* — Thao P Le
(74) *Attorney, Agent, or Firm* — Scully, Scott, Murphy & Presser, P.C.; Daniel P. Morris

(57) ABSTRACT

A method for fabricating a bridge chip assembly for interconnecting two or more IC dies is provided. Each of the IC dies has a first region including first connections having a first pitch and has a second region including second connections or connection pads having a second pitch, the first pitch being greater than the second pitch. The method includes: attaching a non-conductive underfill film on an upper surface of at least the second region of each of the IC dies; bonding the second connections/connection pads of a first IC die to corresponding first connection pads/connections of a bridge chip; and bonding the second connections/connection pads of a second IC die to the bridge chip. The bridge chip assembly includes the bridge chip bonded with the first and second IC dies, and the non-conductive underfill film disposed between the bridge chip and the IC dies.

20 Claims, 9 Drawing Sheets

(56) References Cited

U.S. PATENT DOCUMENTS

| | | | |
|---|---|---|---|
| 10,192,810 B2 | 1/2019 | Karhade et al. | |
| 11,107,791 B2* | 8/2021 | Min | H01L 23/5386 |
| 11,307,496 B2* | 4/2022 | De Silva | H01L 21/0274 |
| 11,308,257 B1* | 4/2022 | Chidambarrao | H01L 23/481 |
| 11,308,540 B2* | 4/2022 | Bhowmick | G06F 16/24578 |
| 11,309,216 B2* | 4/2022 | Reznicek | H01L 21/76843 |
| 11,309,246 B2* | 4/2022 | Dabral | H01L 23/5386 |
| 11,309,383 B1* | 4/2022 | Choi | H01L 21/022 |
| 11,309,408 B2* | 4/2022 | Leobandung | H01L 29/16 |
| 11,310,921 B2* | 4/2022 | Giesen | H05K 1/115 |
| 2003/0034128 A1 | 2/2003 | Matsumura et al. | |
| 2014/0175636 A1 | 6/2014 | Roy et al. | |
| 2019/0164806 A1 | 5/2019 | Leobandung | |
| 2019/0295952 A1* | 9/2019 | Sikka | H01L 23/055 |
| 2020/0176384 A1* | 6/2020 | Wu | H01L 21/4857 |
| 2021/0028080 A1* | 1/2021 | Pietambaram | H01L 21/4857 |
| 2021/0050318 A1* | 2/2021 | Marquart | H01L 25/0655 |
| 2021/0074645 A1* | 3/2021 | Tsai | H01L 24/45 |
| 2021/0082894 A1* | 3/2021 | Chen | H01L 21/82 |
| 2021/0134724 A1* | 5/2021 | Rubin | H01L 25/18 |
| 2021/0134728 A1* | 5/2021 | Rubin | H01L 25/50 |
| 2021/0193518 A1* | 6/2021 | Aleksov | H01L 21/76838 |
| 2021/0193577 A1* | 6/2021 | Lin | H01L 23/3128 |
| 2021/0193637 A1* | 6/2021 | Jeng | H01L 23/5384 |
| 2021/0249381 A1* | 8/2021 | Knickerbocker | H01L 23/562 |
| 2021/0375741 A1* | 12/2021 | Tsou | H01L 23/49816 |
| 2021/0384130 A1* | 12/2021 | Cheah | H01L 23/66 |
| 2022/0052023 A1* | 2/2022 | Fu | H01L 23/5389 |
| 2022/0093559 A1* | 3/2022 | Du | H01L 24/16 |

* cited by examiner

STRUCTURE AND METHOD FOR BRIDGE CHIP ASSEMBLY WITH CAPILLARY UNDERFILL

BACKGROUND

The present invention relates generally to the electrical, electronic and computer arts, and, more particularly, to integrated circuit (IC) packaging structures and methods of fabricating such structures.

The number of technology options continues to grow for advanced IC packaging, such as the introduction of silicon interposers or the shift towards modularization through multiple-chip module designs. Silicon interposers pose cost challenges as they are expensive and require a large silicon footprint, while multiple-chip module designs which use conventional packaging on organic substrates are limited by input/output (I/O) bandwidth and power efficiency.

An attempted solution to address the problems presented with silicon interposers and chip modularization has been the industry's introduction of intermediary silicon dies—so-called silicon bridges—that connect two logic chips together (e.g., accelerator and high-bandwidth memory chips). These intermediary silicon dies are employed only in a limited scope, not using the same footprint as a full silicon interposer. One silicon bridge technology available from Intel Corporation, called Embedded Multi-die Interconnect Bridge (EMIB), makes use of a tiny piece of silicon with routing layers embedded in a common substrate that connects one chip to another in an IC package. The use of an embedded bridge structure, however, is costly and can increase a length of connection routes in the IC package.

In conventional IC packaging methodologies, thermocompression bonding (TCB) of copper pillar flip-chips with non-conductive paste (NCP) as pre-applied underfill is one of the solutions for bonding thin fine-pitch flip-chip devices onto organic substrates having a die thickness of greater than about 60 μm. However, this bonding process involves NCP spreading and curing together with solder wetting and joint formation processes. Several vital failure modes, such as NCP filler entrapment, NCP voiding issues, cracking and solder non-wetting, among other problems, may occur if process parameters and bonding profiles are not carefully optimized.

SUMMARY

Aspects of the present invention, as manifested in one or more embodiments thereof, provide a bridge chip assembly having non-conductive film underfill for interconnecting two or more integrated circuit (IC) dies, and methods for fabricating a bridge chip assembly.

In accordance with an embodiment of the invention, a method of fabricating a bridge chip assembly having non-conductive underfill for interconnecting two or more IC dies is provided. Each of the IC dies has a first region including first connections having a first pitch associated therewith and has a second region including second connections or connection pads having a second pitch associated therewith, the first pitch being greater than the second pitch. The method includes: attaching a non-conductive underfill film on an upper surface of at least the second region of each of the IC dies; bonding a first one of the IC dies to a bridge chip using the second connections or connection pads thereof, the bridge chip including at least first connection pads or connections having the second pitch associated therewith, the first connection pads or connections of the bridge chip being aligned with the corresponding second connections or connection pads of the first one of the IC dies; and bonding a second one of the IC dies to the bridge chip using the second connections or connection pads thereof, the bridge chip including second connection pads or connections having the second pitch associated therewith, the second connection pads or connections of the bridge chip being aligned with the corresponding second connections or connection pads of the second one of the IC dies. The bridge chip assembly includes the bridge chip bonded with at least the first and second IC dies, and the non-conductive underfill film disposed between the bridge chip and the first and second IC dies.

In accordance with another embodiment of the invention, a bridge chip assembly structure includes at least first and second IC dies. Each of the IC dies includes a first plurality of connections having a first pitch associated therewith formed on an upper surface thereof, the first plurality of connections including material having a first melting point and being adapted for bonding the bridge chip assembly structure with an organic substrate. The bridge chip assembly structure further includes a bridge chip comprising a second plurality of connections having a second pitch associated therewith formed on an upper surface thereof, the first pitch being greater than the second pitch. The second plurality of connections are bonded with corresponding connection pads formed on the respective upper surfaces of the IC dies, the second plurality of connections including material having a second melting point, the first and second melting points being different.

In accordance with yet another embodiment of the invention, a bridge chip assembly structure includes at least first and second IC dies. Each of the IC dies includes a first plurality of connections having a first pitch associated therewith formed on an upper surface thereof, the first plurality of connections being configured for bonding the bridge chip assembly structure with an organic substrate. The bridge chip assembly structure further includes a bridge chip including a second plurality of connections having a second pitch associated therewith formed on an upper surface thereof, the first pitch being greater than the second pitch. The second plurality of connections are bonded with corresponding connection pads formed on the respective upper surfaces of the IC dies. The bridge chip includes an opening formed therethrough configured for conveying underfill material disposed in an interior space between the bridge chip and the IC dies.

In accordance with still another embodiment of the invention, a method for fabricating a bridge chip assembly having non-conductive underfill for interconnecting two or more IC dies is provided. Each of the IC dies includes a first region comprising a plurality of connections having a first pitch associated therewith and a second region comprising a plurality of connection pads having a second pitch associated therewith, the first pitch being greater than the second pitch. The method includes: providing a bridge chip comprising at least first and second pluralities of connections having the second pitch associated therewith; attaching a non-conductive underfill film on an upper surface of the bridge chip and covering the first and second pluralities of connections; bonding a first one of the IC dies to the bridge chip using the plurality of connections pads thereof, the first plurality of connections of the bridge chip being aligned with the corresponding plurality of connection pads of the first one of the IC dies; and bonding a second one of the IC dies to the bridge chip using the plurality of connection pads thereof, the second plurality of connections of the bridge chip being aligned with the corresponding plurality of connection pads of the second one of the IC dies. The bridge chip assembly includes the bridge chip bonded with at least the first and second IC dies, and the non-conductive underfill film disposed between the bridge chip and the first and second IC dies.

Techniques as disclosed herein can provide substantial beneficial technical effects. By way of example only and without limitation, one or more embodiments may provide one or more of the following advantages:

use of a non-conductive underfill film on the surface of the IC dies or on the surface of the bridge chip prior to joining the bridge chip to the IC dies essentially eliminates the need for capillary underfill or non-conductive paste underfill, thereby avoiding filler entrapment and/or crack formation during bridge chip joining;

use of a solder hierarchy in the bridge chip assembly components prevents large solder bumps from melting during joining of the bridge chip to the IC dies, thereby reducing the occurrence of oxidation, movement/misalignment and/or bridging;

use of a solder hierarchy in the bridge chip assembly components prevents bridge chip interconnects from melting during subsequent bonding of the bridge chip assembly to an organic substrate;

use of a dam formed on the surface of the bridge chip and/or IC dies prevents underfill material from flowing beyond intended bridge chip interconnects;

formation of an injection hole through the bridge chip provides a means of introducing underfill material between the bridge chip and the IC dies, after fabrication of the bridge chip assembly, in a manner which reduces the likelihood of underfill entrapment and/or crack formation.

These and other features and advantages will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

Figure 1A:
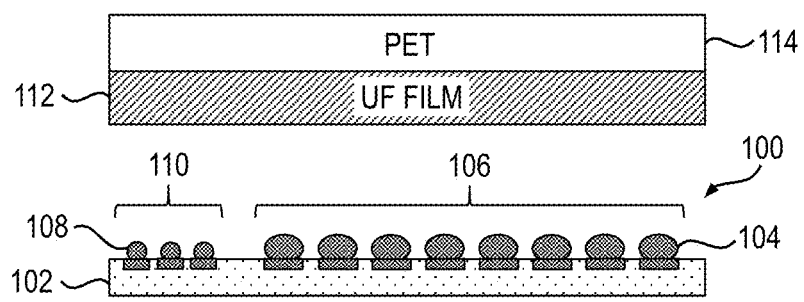
FIGS. 1A through 1G are cross-sectional and top perspective views depicting intermediate processing steps in an overall semiconductor fabrication methodology for forming an exemplary bridge chip assembly structure, according to one or more embodiments of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of an illustrative bridge chip assembly having non-conductive film underfill for interconnecting two or more integrated circuit (IC) dies, and methods for fabricating a bridge chip assembly. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the present disclosure.

It is to be appreciated that the various layers, regions and/or components shown in the accompanying figures may not be drawn to scale. Furthermore, one or more semiconductor layers of a type commonly used in such integrated circuit structures may not be explicitly shown in a given figure for economy of description. This does not imply, however, that the semiconductor layer(s) not explicitly shown are omitted in the actual integrated circuit structure.

As previously stated, conventional thermo-compression bonding (TCB) of copper pillar flip-chips with non-conductive paste (NCP) as pre-applied underfill is conventionally used for bonding thin and thick, fine-pitch flip-chip devices onto organic substrates. However, this bonding process involves NCP spreading and curing together with solder wetting and joint formation processes, which can introduce several critical failure modes, including, but not limited to, NCP filler entrapment, NCP voiding issues, cracking and solder non-wetting, among other problems. In order to overcome one or more of these problems, embodiments of the invention provide a novel method and structure for bridge chip assembly with capillary underfill.

FIGS. 1A through 1G are cross-sectional and top perspective views depicting intermediate processing steps in an overall semiconductor fabrication methodology for forming an exemplary bridge chip assembly structure, according to one or more embodiments of the invention. With reference to FIG. 1A, a first IC die 100 is shown that includes a semiconductor substrate 102 having a first plurality of connections, which in this illustrative embodiment comprises solder bumps (e.g., C4 solder bumps) 104, formed on an upper surface of the substrate in a first region 106 of the substrate, and a second plurality of connections, which in this embodiment comprises solder bumps (e.g., microbumps) 108, formed on the upper surface of the substrate in a second region 110 thereof. The first IC die 100 may be one of a plurality of dies formed on a semiconductor wafer.

The first plurality of solder bumps 104 is formed having a prescribed first size and pitch, and the second plurality of solder bumps 108 is formed having a prescribed second size and pitch, the first size being larger than the second size, and the second pitch being finer (i.e., closer) than the first pitch. For example, in one or more embodiments, the size of the first plurality of solder bumps 104 is about 60-120 microns (μm), preferably about 85 μm, and the size of the second plurality of solder bumps 108 is about 10-40 μm. Likewise, adjacent solder bumps in the first region 106 of the substrate 102 are preferably spaced about 100-200 μm apart, more preferably about 150 μm bump pitch, and adjacent solder bumps in the second region 110 of the substrate are preferably spaced about 20-80 μm apart. It is to be appreciated, however, that embodiments of the invention are not limited to any specific dimensions or spacing of the respective pluralities of solder bumps 104, 108 on the first IC die 100. In one or more embodiments, the larger first plurality of solder bumps 104 are used to electrically connect with corresponding pads on an organic packaging laminate or substrate, while the smaller second plurality of solder bumps 108 are used to electrically connect to corresponding pads on a bridge chip for interconnecting two or more IC dies.

In order to provide structural support for at least the more closely pitched solder bumps 108, a laminate structure is applied to an upper surface of the wafer, covering the solder bumps in at least the second region 110 of the IC die 100. In this embodiment, because the laminate structure is applied over the entire wafer, the solder bumps 104 in the first region 106 of the IC die 100 will also benefit from the structural support of the laminate structure. In one or more embodiments, the laminate structure comprises a non-conductive underfill (UF) film 112, or non-conductive film (NCF), and a polyethylene terephthalate (PET) layer 114 formed on at least a portion of an upper surface of the underfill film. The underfill film, in one or more embodiments, comprises 20-80 weight percent (wt %) epoxy resin, 10-35 wt % curing agent, and 5-60 wt % silica. The PET layer 114 preferably functions as a substrate or other support structure to facilitate handling of the underfill film 112 as it is being attached to the IC die 100; that is, PET is used for handling the underfill film 112 (i.e., NCF layer) during application. The laminate structure is attached onto an upper surface of the wafer, including the first IC die 100, for example using a known lamination or similar bonding process. For example, a suitable illustrative lamination process may involve a vacuum laminator with a heated rubber roller. For NCF lamination, a stage temperature is about 60-90 degrees Celsius (° C.), vacuum pressure is about 60-90 Pa, and roller pressure is about 0.3-0.7 MPa.

A thickness of the underfill film 112 is preferably configured to be substantially the same as a height of the solder bumps 104, 108 (e.g., about 20 μm-30 μm), or slightly less than that. For example, assuming the height of the solder bumps 108 is about 20 μm, a thickness of the underfill film 112 is also preferably configured to be about 20 μm or less. In an illustrative thermocompression bonding (TCB) process, pressure and heat are applied to the die in such a manner that the solder bumps will break through the underfill film, even when the thickness of the film is slightly greater than the height of the solder bumps, to thereby expose the solder bumps for providing electrical connection thereto; the underfill film thickness can also be slightly thinner than the height of the solder bumps. It is to be understood that embodiments of the invention are not limited to any specific dimensions of the underfill film 112 and/or the solder bumps 104, 108.

Figure 1B:
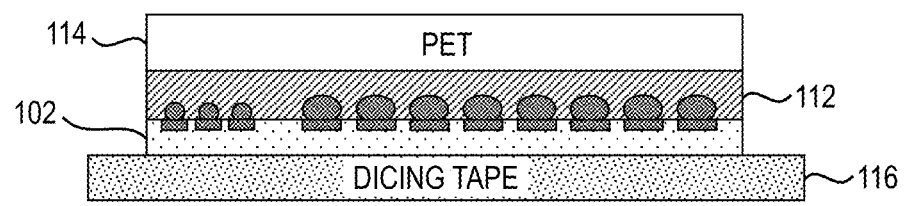
Figure 1C:
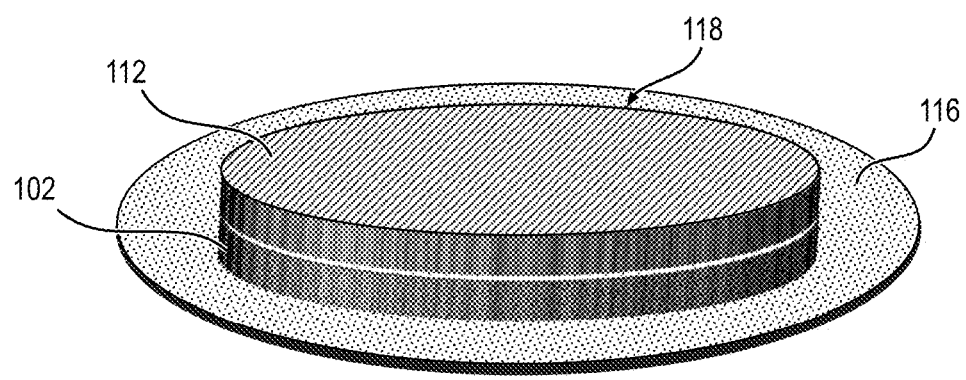

A bottom surface of the wafer, with the laminate structure (including the underfill film 112 and PET layer 114) attached to the upper surface of the wafer, is then adhesively attached to a layer of dicing tape 116, as shown in FIG. 1B. The dicing tape 116 is preferably configured to extend to or beyond the outer periphery of the wafer, although embodiments of the invention are not limited to any specific dimensions of the dicing tape. The PET layer 114 is then removed, such as by using a film peeling process. FIG. 1C depicts a top perspective view of the overall wafer, including the substrate 102 and underfill film 112, attached to the dicing tape 116.

Figure 1D:
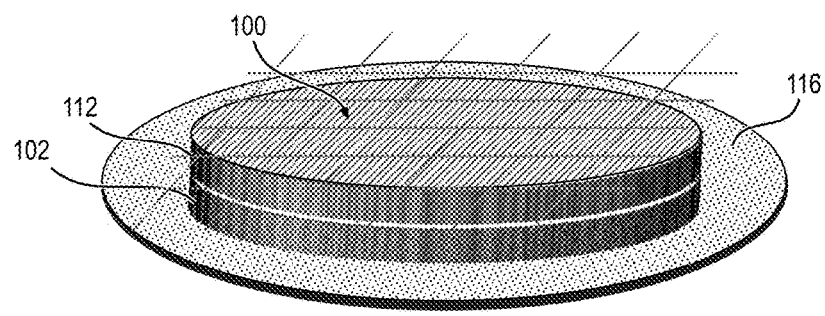

As will be known by those skilled in the art, dicing tape is an adhesive backing tape used during wafer dicing; the dicing tape holds the dies together during the cutting process. Dicing tape suitable for use with embodiments of the invention can be made of a variety of backing materials, including polyvinyl chloride (PVC), polyolefin, polyethylene, etc., with an adhesive to hold the dies in place. As shown in FIG. 1D, the wafer is diced into a plurality of individual dies, including the first IC die 100. The dicing process can involve, for example, scribing and breaking, mechanical sawing (e.g., using a dicing saw), or laser cutting, among other wafer dicing methodologies known by those skilled in the art. The laminated non-conductive underfill film is adapted to be robust enough to avoid being damaged during the wafer dicing process.

Figure 1E:
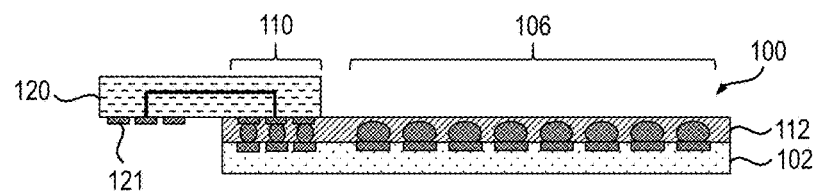

With reference to FIG. 1E, the first IC die 100 is shown after dicing and removal from the dicing tape backing. A bridge chip 120 is then bonded to the first IC die 100 using a flip-chip process, such that connection pads 121 formed on an upper surface of the bridge chip, when flipped upside down, are aligned with corresponding solder bumps (108 in FIG. 1A) on an opposing surface in the second region 110 of the first IC die. The bridge chip 120, in this exemplary embodiment, does not include microbumps but instead includes fine pitch pads 121, as previously stated. Consequently, the bridge chip 120 does not require an underfill film serving as a protection layer. In alternative embodiments, wherein the bridge chip does include fine pitch connections, a non-conductive underfill film is applied to protect the bridge chip connections, as will be described in more detail herein below in conjunction with FIGS. 3A-3E.

The bridge chip 120 is preferably bonded with the first IC die 100 using a TCB process which, as previously explained, involves the simultaneous application of heat and pressure to the mating surfaces by a hard-faced bonding tool. The factors of the selected temperature and applied pressure will depend primarily on diffusion rates of the materials forming the connections. By way of example only, the bonding head peak temperature can be from about 320 to 400° C. and the stage temperature can be about 50 to 150° C. with an applied force greater than about 30 to 400 newtons (N) for about 2 to 60 seconds.

Figure 1F:
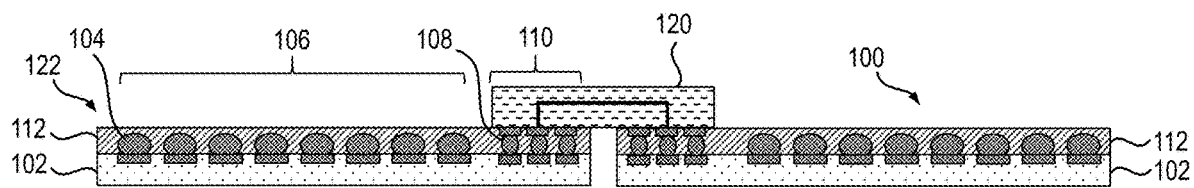

Similarly, FIG. 1F depicts bonding of a second IC die 122 to the bridge chip 120, according to one or more embodiments of the invention. The second IC die 122, like the first IC die 100, includes a semiconductor substrate 102 having a first plurality of connections, which in this illustrative embodiment comprises solder bumps 104, formed on an upper surface of the substrate in a first region 106 of the substrate, and a second plurality of connections, which in this embodiment comprises solder bumps 108, formed on the upper surface of the substrate in a second region 110 thereof. The first plurality of solder bumps 104 is formed having a prescribed first size and pitch, and the second plurality of solder bumps 108 is formed having a prescribed second size and pitch, the first size being larger than the second size, and the second pitch being finer than the first pitch. The size and pitch of the solder bumps 104, 108 formed on the second IC die 122 are not necessary the same as the size and pitch of the solder bumps 104, 108 formed on the first IC die 100. It is to be appreciated that embodiments of the invention are not limited to any specific dimensions or spacing of the respective pluralities of solder bumps 104, 108 on the second IC die 122.

In order to provide structural support for at least the more closely pitched solder bumps 108, the second IC die 122 includes a laminate structure applied to an upper surface of the wafer, covering the solder bumps in at least the second region 110 of the second IC die. In this embodiment, because the laminate structure is applied over the entire wafer, the solder bumps 104 in the first region 106 of the second IC die 122 will also benefit from the structural support of the laminate structure. In one or more embodiments, the laminate structure comprises a non-conductive underfill film 112 attached onto an upper surface of the wafer, including the second IC die 122, for example using a known lamination process fabricated in a manner consistent with the laminate structure attached onto the upper surface of the first IC die 100, as previously described in conjunction with FIGS. 1A through 1D.

The bridge chip 120 is bonded to the second IC die 122, for example using a TCB process consistent with the manner in which the bridge chip is bonded to the first IC die 100, such that connection pads formed on the upper surface of the bridge chip, when flipped upside down, are aligned with corresponding solder bumps on an opposing surface in the second region 110 of the second IC die. More particularly, in one or more embodiments heat and pressure are simultaneously applied to the mating surfaces (e.g., by a hard-faced bonding tool or the like). As previously stated, the parameters of the selected temperature and applied pressure, as well as the duration thereof, will depend primarily on diffusion rates of the materials forming the connections.

Figure 1G:
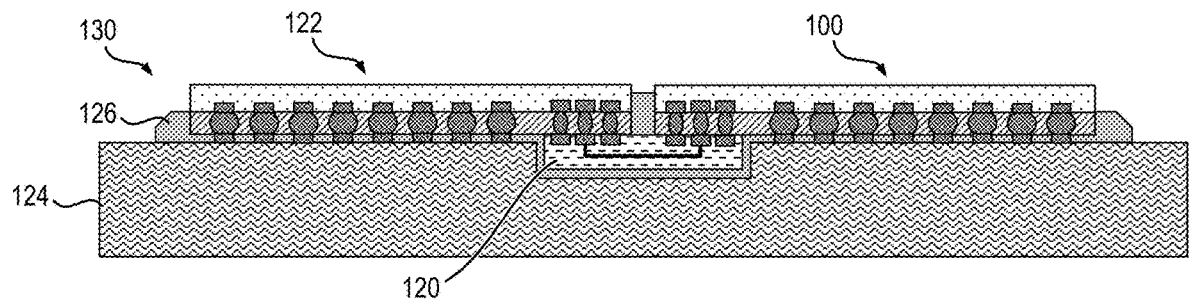

In FIG. 1G, the resulting bridge chip assembly, including the bridge chip 120 bonded to the first and second IC dies 100 and 122, respectively, is joined to an organic substrate 124. In this illustrative embodiment, the organic substrate 124 includes a recess formed therein adapted to receive the bridge chip 120 when the bridge chip assembly is inverted, to enable the solder bump connections (104 in FIG. 1F) formed on the first and second IC dies 100, 122 to be planar with and electrically contact corresponding pads formed on an upper surface of the organic substrate 124. A TCB process or furnace reflow process can be used to bond the bridge chip assembly (100, 120, 122) with the organic substrate 124. In one or more embodiments, bonding the bridge chip assembly with the organic substrate 124 may be optionally followed by forming a capillary underfill layer 126 surrounding the larger solder bumps and substantially filling gaps between the bridge chip assembly and the organic substrate 124 resulting in a multi-die structure 130 as shown.

As previously stated, the IC dies in the bridge chip assembly include at least first and second sets of connections, however the finer pitch connections are the most fragile and therefore of most concern. For the illustrative embodiment described in connection with FIGS. 1A through 1G, the non-conductive underfill film is disposed over the entire wafer, including over both the fine pitch (i.e., narrow) and coarse pitch (i.e., wide) connections. In an alternative embodiment, the underfill film is only applied in the fine pitch connection regions of the wafer.

Figure 2A:
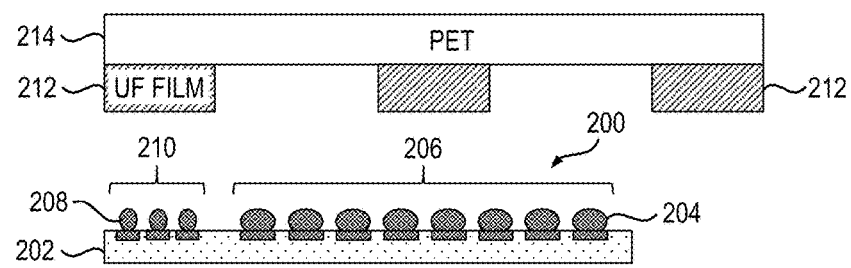
FIGS. 2A through 2E are cross-sectional views depicting intermediate processing steps in an overall semiconductor fabrication methodology for forming an exemplary bridge chip assembly structure having a non-conductive underfill film application restricted to fine pitch connection regions of the bonded dies, according to one or more alternative embodiments of the invention.

FIGS. 2A through 2E are cross-sectional views depicting intermediate processing steps in an overall semiconductor fabrication methodology for forming an exemplary bridge chip assembly structure having an underfill film application restricted to fine pitch connection regions of the bonded dies, according to one or more alternative embodiments of the invention. With reference to FIG. 2A, a first IC die 200 is shown that includes a semiconductor substrate 202 having a first plurality of connections, which in this illustrative embodiment comprises solder bumps 204, formed on an upper surface of the substrate in a first region 206 thereof, and a second plurality of connections, which in this embodiment comprises solder bumps 208, formed on the upper surface of the substrate in a second region 210 thereof. The first IC die 200 may be one of a plurality of dies formed on a semiconductor wafer.

Figure 2B:
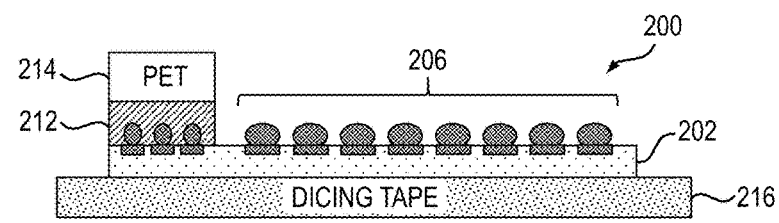

A laminate structure including a non-conductive underfill (UF) film 212 attached to a PET layer 214 is formed. In a manner consistent with the underfill film previously described, the underfill film 212 may comprise about 20-80 wt % epoxy resin, about 10-35 wt % curing agent, and about 5-60 wt % silica. Unlike the laminate structure formed in connection with the bridge chip assembly fabrication process described in conjunction with FIGS. 1A through 1G, the underfill film 212 is configured as a plurality of separate patterned portions, each portion having a width adapted to cover only the fine pitch connections 208 in the second region 210 of the first IC die 200. As shown in FIG. 2B, the laminate structure, comprising the underfill film 212 and PET layer 214, is attached onto an upper surface of the first IC die 200 in the second (fine pitch) region 210, for example using a known lamination process. As depicted in FIG. 2B, the fine pitch connections on the first die 200 (in the second region 210 shown in FIG. 2A) are protected by the laminate structure, while leaving the coarse pitch connections in the first region 206 of the first die exposed. These coarse pitch connections in the first region 206 will be subsequently protected using standard capillary underfill material.

Like the underfill film 112 shown in FIG. 1B, a thickness of the underfill film 212 is preferably configured to be substantially the same as a height of the solder bumps 208, or slightly less than that. As previously stated, in an illustrative TCB process, pressure and heat are applied to the die in such a manner that the solder bumps will break through the underfill film, even when the thickness of the film is slightly greater than the height of the solder bumps, to thereby expose the solder bumps for providing electrical connection thereto. It is to be understood that embodiments of the invention are not limited to any specific dimensions of the underfill film 212 and/or solder bumps 208.

With continued reference to FIG. 2B, a bottom surface of the wafer, with the attached laminate structure (including the underfill film 212 and PET layer 214) is adhesively attached to a layer of dicing tape 216. The dicing tape 216 preferably extends to or slightly beyond the outer periphery of the wafer, although embodiments of the invention are not limited to any specific dimensions of the dicing tape. The PET layer 214 is then removed, such as by using a film peeling process. FIG. 1C depicts a top perspective view of the overall wafer, including the substrate 102 and underfill film 112, attached to the dicing tape 116.

Figure 2C:
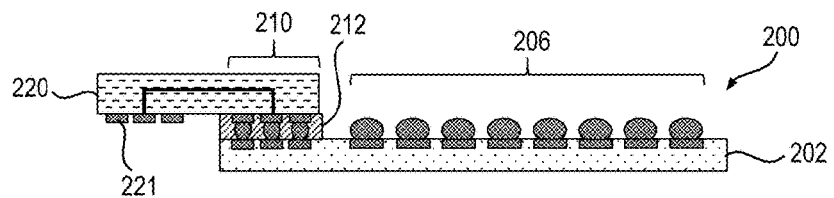

Turning now to FIG. 2C, the first die 200 is shown after dicing and removal from the dicing tape backing (216 in FIG. 2B). A bridge chip 220 is then bonded to the first IC die 200 using a flip-chip process, such that connection pads 221 formed on an upper surface of the bridge chip, when flipped upside down, are aligned with corresponding solder bumps (208 in FIG. 2A) on an opposing surface in the second region 210 of the first IC die. The bridge chip 220 is preferably bonded with the first IC die 200 using a TCB process which, as previously explained, involves the simultaneous application of heat and pressure to the mating surfaces by a hard-faced bonding tool. The factors of the selected temperature and applied pressure will depend primarily on diffusion rates of the materials forming the connections. By way of example only, the bonding head peak temperature can be from about 320 to 400° C. and stage temperature can be about 50 to 150° C. with an applied force greater than about 30 to 400 newtons (N) for about 2 to 60 seconds.

Figure 2D:
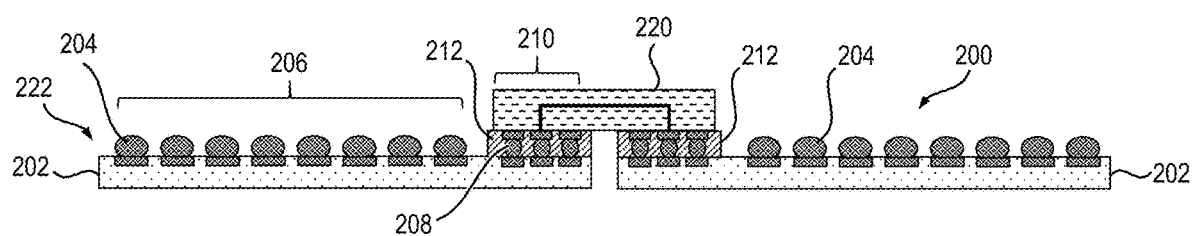

FIG. 2D depicts bonding of a second IC die 222 to the bridge chip 220, according to one or more embodiments of the invention. The second IC die 222, like the first IC die 200, includes a semiconductor substrate 202 having a first plurality of connections, which in this illustrative embodiment comprises solder bumps 204, formed on an upper surface of the substrate in a first region 206 of the substrate, and a second plurality of connections, which in this embodiment comprises solder bumps 208, formed on the upper surface of the substrate in a second region 210 thereof. The first plurality of solder bumps 204 is formed having a prescribed first size and pitch, and the second plurality of solder bumps 208 have a prescribed second size and pitch, the first size being larger than the second size, and the second pitch being finer than the first pitch. The size and pitch of the solder bumps 204, 208 formed on the second IC die 222 are not necessary the same as the size and pitch of the solder bumps 204, 208 formed on the first IC die 200. It is to be appreciated that embodiments of the invention are not limited to any specific dimensions or spacing of the respective pluralities of solder bumps 204, 208 on the second IC die 222.

In order to provide structural support for the closely pitched solder bumps 208, the second IC die 222 includes a laminate structure applied to an upper surface of the wafer, covering the solder bumps in the second region 210 of the second IC die. In this exemplary embodiment, the solder bumps 204 in the first region 206 of the second IC die 222 are not protected by the laminate structure but remain exposed, as previously explained. In one or more embodiments, the laminate structure comprises a non-conductive underfill film 212 attached onto an upper surface of the wafer, including the second IC die 222, for example using a known lamination process, which is preferably fabricated in a manner consistent with the laminate structure attached onto the upper surface of the first IC die 200, as previously described in conjunction with FIGS. 2A through 2C.

The bridge chip 220 is bonded to the second IC die 222, for example using a TCB process consistent with the manner in which the bridge chip is bonded to the first IC die 200, such that connection pads formed on the upper surface of the bridge chip, when flipped upside down, are aligned with corresponding solder bumps on an opposing surface in the second region 210 of the second IC die. More particularly, in one or more embodiments heat and pressure are simultaneously applied to the mating surfaces (e.g., by a hard-faced bonding tool or the like). As previously stated, the parameters of the selected temperature and applied pressure, as well as the duration thereof, will depend primarily on diffusion rates of the materials forming the connections.

Figure 2E:
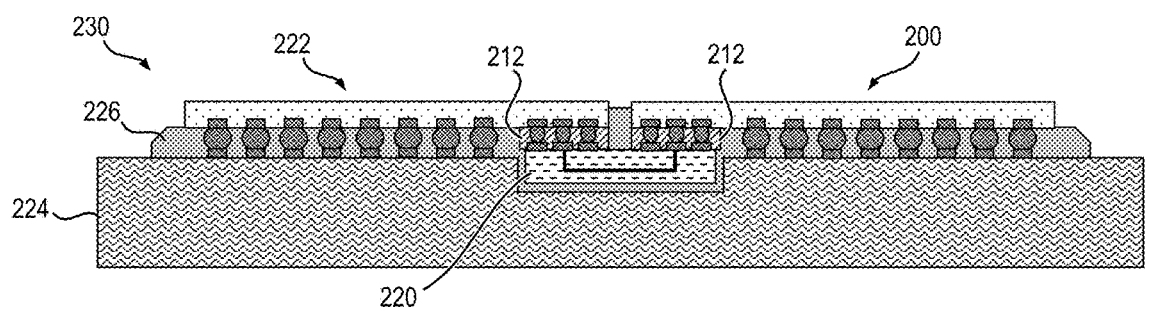

In FIG. 2E, the resulting bridge chip assembly, including the bridge chip 220 bonded to the first and second IC dies 200 and 222, respectively, is joined to an organic substrate 224. In this illustrative embodiment, the organic substrate 224 includes a recess formed therein adapted to receive the bridge chip 220 when the bridge chip assembly is inverted, to enable the solder bump connections (204 in FIG. 2D) formed on the first and second IC dies 200, 222 to be planar with and electrically contact corresponding pads formed on an upper surface of the organic substrate 224. A TCB process or furnace reflow process can be used to bond the bridge chip assembly (200, 220, 222) with the organic substrate 224. In one or more embodiments, bonding the bridge chip assembly with the organic substrate 224 is followed by forming a capillary underfill layer 226 surrounding the larger solder bumps (204 in FIG. 2D) and substantially filling gaps between the bridge chip assembly and the organic substrate 224 resulting in a multi-die structure 230 as shown.

For the illustrative embodiments shown in FIGS. 1A-1G and 2A-2E, the underfill film (112, 212) was disposed on the surface of the IC dies prior to the dies being bonded to the bridge chip in order to protect at least the fine pitch connections (e.g., microbumps) included on the IC dies during the bonding process. In one or more alternative embodiments, the bridge chip itself includes fine pitch connections, and the IC dies to which the bridge chip is bonded includes corresponding pads on the upper surface thereof. Consequently, in order to protect the fine pitch connections on the bridge chip during bonding of the bridge chip to the multiple IC dies, the underfill film is disposed on the fine pitch connections of the bridge chip prior to the bonding process, rather than on the IC dies.

Figure 3A:
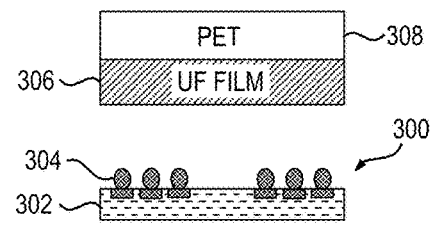
FIGS. 3A through 3E are cross-sectional views depicting intermediate processing steps in an overall semiconductor fabrication methodology for forming an exemplary bridge chip having a non-conductive underfill film disposed on fine pitch connections thereof, according to an embodiment of the invention.

By way of example only and without limitation, FIGS. 3A through 3E are cross-sectional views depicting intermediate processing steps in an overall semiconductor fabrication methodology for forming an exemplary bridge chip 300 having an underfill film disposed on fine pitch connections thereof, according to an embodiment of the invention. With reference to FIG. 3A, a bridge chip 300 is shown that comprises a semiconductor substrate 302 and a plurality of fine pitch connections (e.g., solder microbumps) 304 formed on an upper surface of at least a portion of the substrate.

A laminate structure, to be attached to the bridge chip 300 for protecting the fine pitch connections 304, includes a non-conductive underfill (UF) film 306 and a PET layer 308 formed on an upper surface of the underfill film. The underfill film 306 of the laminate structure is configured having a width that at least covers the fine pitch connections 304 and having a cross-sectional thickness that is about the same as a height of the fine pitch connections 304. Consistent with the composition of the underfill films 112 and 212 previously described in conjunction with FIGS. 1A and 2A, respectively, the underfill film 306 of the laminate structure depicted in FIG. 3A comprises 20-80 wt % epoxy resin, 10-35 wt % curing agent and 5-60 wt % silica. It is to be appreciated that embodiments of the invention contemplate numerous suitable alternative compositions for the underfill film, as will become apparent to those skilled in the art.

Figure 3B:
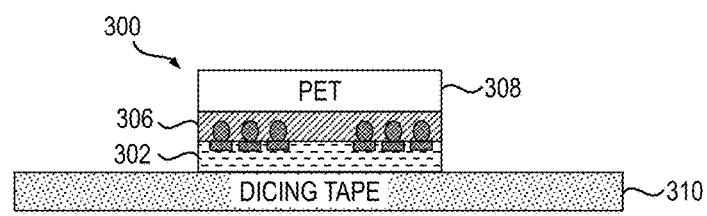

As shown in FIG. 3B, the laminate structure, comprising the underfill film 306 and PET layer 308, is attached onto an upper surface of the bridge chip 300, for example using a known lamination process. The bridge chip 300 is preferably one of a plurality of such chips formed on a semiconductor wafer. As apparent from FIG. 3B, the fine pitch connections (304 in FIG. 3A) on the bridge chip 300 are protected by the laminate structure. A bottom surface of the wafer, comprising the bridge chip 300 with the attached laminate structure (including the underfill film 306 and PET layer 308), is adhesively attached to a layer of dicing tape 310. The dicing tape 310 preferably extends to or slightly beyond the outer periphery of the bridge chip 300, although embodiments of the invention are not limited to any specific dimensions of the dicing tape. After attaching the bridge chip 300 with the laminate structure to the dicing tape 310, the PET layer 308 is removed, such as by using a film peeling process.

Figure 3C:
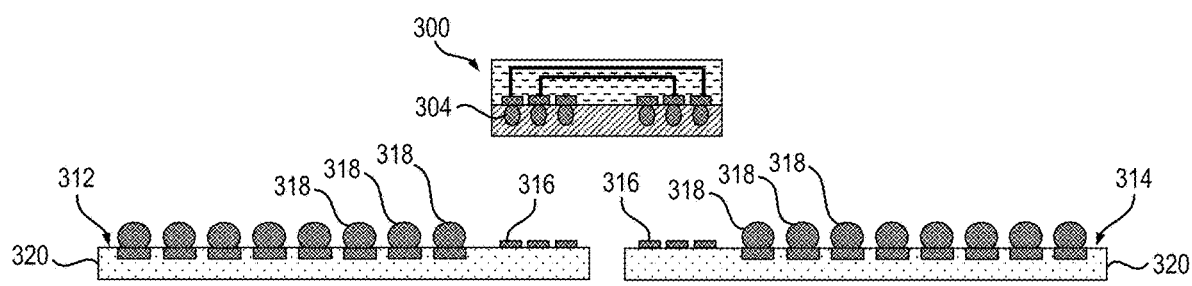

FIG. 3C conceptually shows the bridge chip 300, after dicing has been performed (e.g., using a dicing process as described in conjunction with FIG. 1D), inverted and aligned for bonding with a first IC die 312 and a second IC die 314. Each of the first and second IC dies 312, 314 includes one or more connection pads 316 formed on an upper surface of a substrate 320 of the IC die. The connection pads 316 are configured having a pitch (i.e., spacing) that matches the pitch of the fine pitch connections 304 formed on the bridge chip 300. Each of the first and second IC dies 312, 314 further includes a plurality of larger, coarser pitch connections (e.g., solder bumps) 318 formed on the upper surface of the substrate 320. These coarser pitch connections 318 are adapted for use in subsequently bonding the respective first and second IC dies 312, 314 to an organic package or substrate.

Figure 3D:
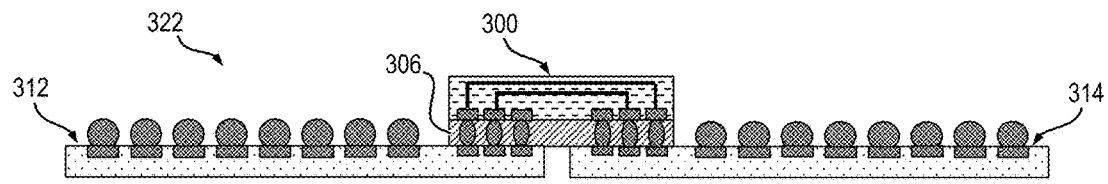

FIG. 3D depicts the bridge chip 300 bonded to the first and second IC dies 312 and 314, respectively, to form a bridge chip assembly 322. In forming the bridge chip assembly 322, the bridge chip 300 is attached to the first IC die 312 and the second IC die 314 using a flip-chip bonding process, such that the fine pitch connection pads (316 in FIG. 3C) formed on the upper surfaces of the respective first and second IC dies are aligned with corresponding solder microbumps (304 in FIG. 3C) on the opposing upper surface of the bridge chip when the bridge chip is inverted. Unlike the embodiments shown in FIGS. 1F and 2D, the bridge chip 300 shown in FIG. 3D includes the microbumps protected by the underfill film 306, and the IC dies 312, 314 include the fine pitch connection pads, as previously stated. Consequently, the IC dies do not require an underfill film serving as a protection layer.

Aspects according to one or more embodiments of the present invention also contemplate a way to keep the first and second IC dies 312 and 314, respectively, precisely aligned and positioned, and to bond the bridge chip 300 in that location. This method allows the bridge chip 300 to be joined to both the first and second IC dies 312 and 314, respectively, at the same time in one bonding step. One method is to temporarily bond the first IC die 312 to a handling substrate (not shown here) and then temporarily bond the second IC die 314 to the same substrate. This temporarily attached handling substrate is removed after the bridge chip 300 is joined. Alternatively, the first and second IC dies 312 and 314 are temporarily fixed to a jig or the like.

The bridge chip 300 is preferably bonded with the first and second IC dies 312, 314 concurrently using a known TCB process which, as previously explained, generally involves the simultaneous application of heat and pressure to the mating surfaces by a hard-faced bonding tool. The factors of the selected temperature and applied pressure will depend primarily on diffusion rates of the materials forming the connections. By way of example only, the bonding head peak temperature can be from about 320 to 400° C. and the stage temperature can be about 50 to 150° C. with an applied force greater than about 30 to 400 newtons (N) for about 2 to 60 seconds.

Figure 3E:
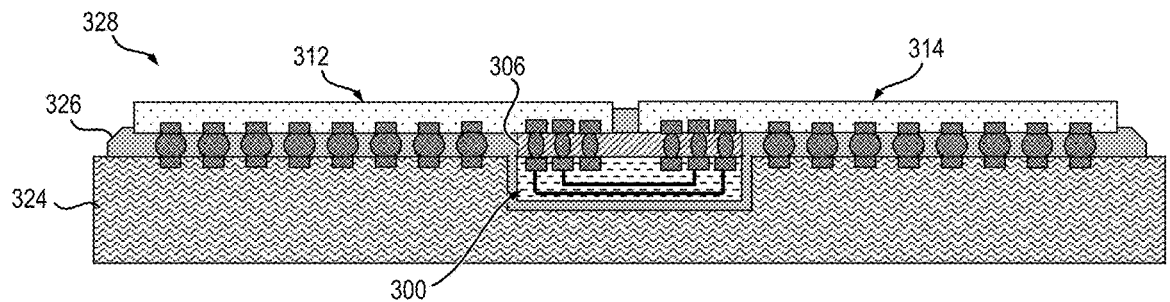

In FIG. 3E, the resulting bridge chip assembly 322, including the bridge chip 300 bonded to the first and second IC dies 312 and 314, respectively, is joined to an organic substrate 324. In this illustrative embodiment, the organic substrate 324 includes a recess formed therein adapted to receive the bridge chip 300 when the bridge chip assembly is inverted, to enable the coarse pitch solder bump connections (318 in FIG. 3C) formed on the first and second IC dies 312, 314 to be planar with and electrically contact corresponding pads formed on an upper surface of the organic substrate 324. A TCB process or reflow furnace process can be used to bond the bridge chip assembly 322 with the organic substrate 324. In one or more embodiments, bonding the bridge chip assembly 322 with the organic substrate 324 is followed by forming a capillary underfill layer 326 surrounding the larger solder bumps (318 in FIG. 3C) and substantially filling gaps between the bridge chip assembly 322 and the organic substrate 324 resulting in a multi-die structure 328 as shown.

Figure 4:
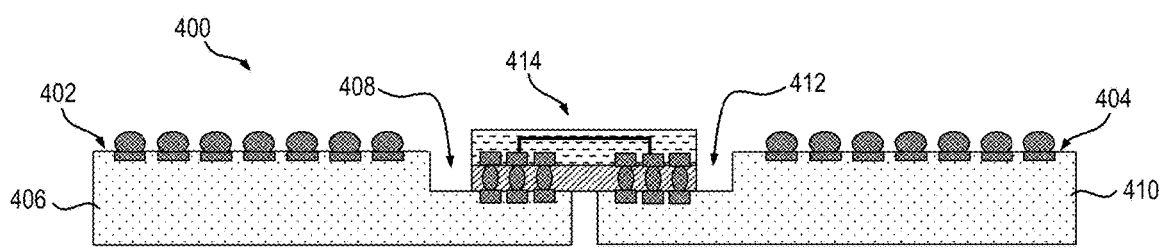
FIG. 4 is a cross-sectional view depicting at least a portion of an exemplary bridge chip assembly configured having a bridge chip attached to multiple integrated circuit dies so that the bridge chip is substantially planar with a plurality of coarse pitch connections formed on an upper surface of the IC dies, according to an embodiment of the invention.

It is to be appreciated that although embodiments have been shown wherein a trench or other recess is formed in the organic substrate adapted to receive the bridge chip, the formation of such trench or recess is optional; that is, the invention contemplates other embodiments in which the formation of a recess in the organic substrate is not required. For example, FIG. 4 is a cross-sectional view depicting at least a portion of an exemplary bridge chip assembly 400 configured having a bridge chip attached to multiple IC dies so that the bridge chip is substantially planar with a plurality of coarse pitch connections formed on an upper surface of the IC dies, according to an embodiment of the invention. The bridge chip assembly 400 includes a first IC die 402 and a second IC die 404. The first IC die 402 comprises a substrate 406 configured having a stepped end portion 408 which is thinner relative to a remaining portion of the substrate. Likewise, the second IC die 404 comprises a substrate 410 such that an end having a stepped end portion 412 which is thinner relative the rest of the substrate. The stepped ends 408, 412 of the respective first and second IC dies 402, 404 include one or more fine pitch connection pads formed on an upper surface thereof that are aligned with corresponding fine pitch solder connections (e.g., solder microbumps) formed on a bridge chip 414 which, when inverted, is attached to the first and second IC dies. For each IC die, a depth of the stepped portion relative to the upper surface of the rest of the substrate is configured so that when the bridge chip is bonded to the IC dies, it is substantially planar with the coarse pitch connections formed on the upper surface of the substrate. In this manner, the bridge chip 414 will not impede the first and second IC dies 402, 404 during bonding with an organic substrate.

In alternative embodiments, the height of the coarse pitch connections (e.g., in region 206 shown in FIGS. 2A-2D) can be made greater than the height of the fine pitch connections (e.g., in region 210 in FIGS. 2A and 2C), such that even with the bridge chip bonded to the IC dies, the coarse pitch connections will make contact with the corresponding connection pads on the organic substrate/laminate without the need for forming an opening or stepped portion in the organic substrate.

Regardless of the underfill methodology used to protect the components of the bridge chip assembly (e.g., non-conductive film, non-conductive paste, capillary underfill, etc., or even omitting the underfill entirely) during bonding of the bridge chip assembly to an organic laminate or substrate, a solder hierarchy is preferably used, in accordance with one or more embodiments of the invention. An important aspect of the solder hierarchy according to the present invention, as manifested in one or more embodiments thereof, is the use of a first solder composition on the bridge chip and the use of a second solder composition on the larger IC dies to which the bridge chip is bonded, the first and second solder compositions having different melting points.

With reference again to FIG. 3C, for example, one or more embodiments of the invention preferably involves using a lower melting point solder composition for the fine pitch connections (e.g., solder microbumps) 304 formed on the upper surface of at least a portion of the bridge chip 300 and using a higher melting point solder composition for the coarser pitch connections (e.g., C4 solder bumps) 318 formed on the upper surfaces of at least a portion of the IC dies 312 and 314. In one or more embodiments, the lower melting point solder composition used for the fine pitch connections on the bridge chip comprises lead-free tin bismuth solder, $Sn_{42}Bi_{58}$, having a eutectic temperature of 138° C., or indium tin solder, $In_{52}Sn_{48}$, having a eutectic temperature of 118° C., or $Bi_{67}In_{33}$, having a eutectic temperature of 109° C., or $Sn_{91}Zn_9$, having a eutectic temperature of 198.5° C., or any of a number of compositions including one or more of tin (Sn), bismuth (Bi), indium (In), silver (Ag), copper (Cu), zinc (Zn), etc., having a melting point of less than about 217° C. In one or more embodiments, the higher melting point solder composition used for the coarse pitch connections on the IC dies comprises lead-free tin silver (SnAg), tin copper (SnCu), or tin silver copper (SnAgCu), or any of a number of other compositions having a melting point greater than about 217° C.

An advantage of this novel solder hierarchy approach is that when the bridge chip is assembled to the larger IC dies (with sequence being immaterial, whether one die is bonded to the bridge chip at a time or multiple dies bonded concurrently), the larger coarse pitch solder bumps having a higher melting point will not melt and will therefore have significantly less chance of oxidation, movement or bridging; problems which continue to plague conventional multi-chip assembly methodologies. Once the smaller IC dies forming the bridge chip assembly are successfully joined to the bridge chip, the larger die bonding to the organic laminate or substrate can proceed. One variation to this approach is to use a small amount of low-temperature solder (e.g., SnBi) that melts and joins the bridge chip but then is at least partially consumed as intermetallic, thus having a smaller solder volume left that will melt during the subsequent bonding of the bridge chip assembly to the organic laminate/substrate.

In accordance with one or more alternative embodiments of the solder hierarchy invention, a higher melting point solder composition or copper pillar or copper hybrid (non-solder bonding) is preferably used on the fine pitch connections (e.g., microbumps) bonding the bridge chip to the IC dies, and a lower melting point solder composition is used for the coarse pitch connections (e.g., C4 solder bumps) on the IC dies bonding the bridge chip assembly to the organic laminate or substrate. When the bridge chip is joined to the IC dies to form the bridge chip assembly (with sequence being immaterial, whether one die is bonded to the bridge chip at a time or multiple dies are concurrently bonded), the coarse pitch solder bumps will be molten. However, due to the wider spacing, there is less concern that the molten solder flow will cause shorts between adjacent connections. During the subsequent joining of the bridge chip assembly to the organic laminate/substrate, the bridge chip interconnections that are formed of a higher melting point material will not melt, thereby preventing shorts from occurring between the fine pitch microbumps.

One advantage of using the non-conductive underfill film during the initial joining of the bridge chip to the IC dies to form the bridge chip assembly, as previously described in conjunction with the illustrative embodiments of FIGS. 1A through 3E, is that application of the underfill film is not subjected to extrusion during the bonding process, and therefore it is much easier to control placement of the underfill film compared to conventional methods. In the case of a non-conductive underfill paste, by contrast, the paste-type underfill material is pushed out as the bridge chip is joined to the IC dies. Consequently, it is difficult to control the amount and direction of the underfill material extruded when bonding the bridge chip to the IC dies. For example, if the amount of underfill paste is too much when joining the bridge chip to the first IC die, it will overflow into the fine pitch connection region used for joining the bridge chip to the second IC die. Alternatively, if the amount of underfill paste is too little, it will not be sufficient to cover the entire area of fine pitch connections corresponding to the IC die being joined.

The manner in which the underfill material (e.g., underfill paste) is pushed out during chip joining will depend upon multiple factors. Some of the factors affecting the manner in which the underfill material is extruded includes, but is not limited to, the temperature of the bonding head/stage, the condition of the chip or substrate surface, and the pattern and density of the solder bumps. Hence, because it is so difficult to control the placement of the flowable underfill material during chip bonding, one or more embodiments of the invention utilize a dam or barrier to restrict the flow of underfill material to only desired areas of the IC dies and/or bridge chip, thereby preventing the underfill material from flowing onto unintended surfaces of the IC dies and/or bridge chip during bonding.

Figure 5A:
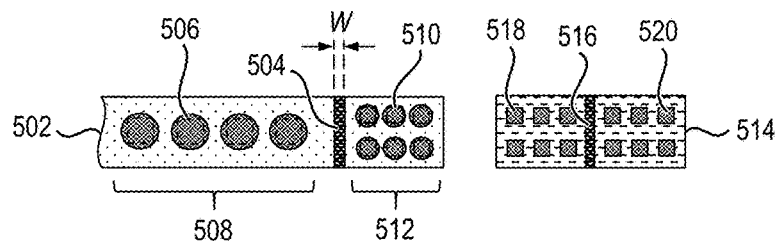
FIG. 5A is a top plan view depicting at least a portion of an exemplary bridge chip and an IC die to be bonded with the bridge chip, each including a dam or barrier, according to an embodiment of the present invention.

FIG. 5A is a top plan view depicting at least a portion of an exemplary bridge chip and an IC die to be joined, each including a dam or barrier, according to an embodiment of the invention. More particularly, a first IC die 502 includes a first dam 504 formed on an upper surface thereof. The first dam 504 has a width that preferably extends across the width of the first IC die 502 from a first edge to a second opposing edge thereof, and serves to divide one or more larger, coarse pitch connections (e.g., C4 solder bumps) 506 formed in a first region 508 of the first IC die, from one or more smaller, fine pitch connections (e.g., microbumps) 510 formed in a second region 512 of the first IC die. Similarly, a bridge chip 514 to which the first IC die 502 will be bonded includes a second dam or barrier 516 formed on an upper surface thereof. The bridge chip 514 may include one or multiple dams as needed. The second dam 516 has a width that preferably extends across the width of the bridge chip 514, from a first edge to a second opposing edge thereof, and serves to divide a first set of fine pitch connection pads 518, aligned with the fine pitch connections 510 on the first IC die 502, and a second set of fine pitch connections pads 520, which are aligned with corresponding fine pitch connections formed on a second IC die (not explicitly shown) to which the bridge chip will be subsequently bonded. The first and second dams 504, 516 are configured to prevent the flow of underfill material (e.g., underfill paste) during bonding of the bridge chip to the IC dies.

In one or more embodiments, the dam structures 504, 516 may comprise essentially any material coating or structure that can be formed on the upper surface of the bridge chip and/or IC dies that is capable of creating a barrier to prevent the flow of underfill material, including, but not limited to, Teflon® (a registered trademark of DuPont). In a first illustrative method for forming the dam, a metal mask is provided with openings that match alignment mark areas that are to be made hydrophobic. Then, a thin coating of Teflon® mold release is sprayed onto the unmasked areas. The mask is released and the wafer is baked at about 315° C. for about ten minutes. This will melt the Teflon® particles and a thin film coating will form. Underfill will not adhere to a Teflon® coated surface. A Miller Stephenson MS 122 AX Teflon spray mold release can be used, as an example.

A second illustrative method for forming the dam preferably involves using photolithography to precisely impart hydrophobicity to alignment mark areas. To accomplish this, a photoresist is deposited on the surface of the wafer, then the wafer is exposed (e.g., using an ultraviolet light source) and developed to reveal the alignment mark areas, according to one or more embodiments of the invention. A self-assembling, hydrophobic molecule or solution, such as octadecyltrichlorosilane in toluene or Teflon AF dissolved in a perfluorinated solvent, is then applied such as by using a spin coating or spray-on process. Alternatively, the wafer can be dipped into a solution of the hydrophobic molecule. Baking, for example at about 310° C. to 330° C. for about ten to fifteen minutes, is then performed to fix the Teflon® AF coating in place.

Alternatively, the dam may comprise a treated region of the substrate having an affinity to the underfill material, such as low surface tension materials or fluorinated polymers. By way of example only and without limitation, suitable low surface tension materials include polytetrafluoroethylene, fluorinated ethylene propylene, perflouroalkoxy, and the like. An exemplary material that can be utilized to form a transparent low surface tension coating is a Miller Stephenson MS 122AX Teflon (polytetrafluoroethylene) spray mold release. In one or more embodiments, a hydrophobic material can be deposited on the surface of the bridge chip or IC die using photolithography or another process. Hydrophobic materials suitable for use with embodiments of the invention include, for example, octadecyltrichlorosilane in toluene, or DuPont™ Teflon® AF dissolved at about 3% to 15% concentration in a perflourinated solvent, among other compositions. It is to be appreciated that embodiments of the invention are not limited to any specific material(s) and/or processes used to form the dam 504.

In one or more embodiments, a width, W, of the dam 504 is about 20 μm-250 μm, dependent on a spacing between coarse and fine pitch connections, and preferably about 100 μm. A vertical height of the dam above the upper surface of the bridge chip or IC die on which the dam is formed is preferably about 20 μm to 100 μm, and more preferably about 60-70 μm. A maximum height of the dam 504 is preferably lower than a height of the larger coarse pitch connections 506 above the upper surface of the first IC die 502. Furthermore, a cross-sectional thickness of the low surface tension material is less than about 100 μm. It is to be understood, however, that embodiments of the invention are not limited to any specific dimensions or shapes of the dam 504.

Figure 5B:
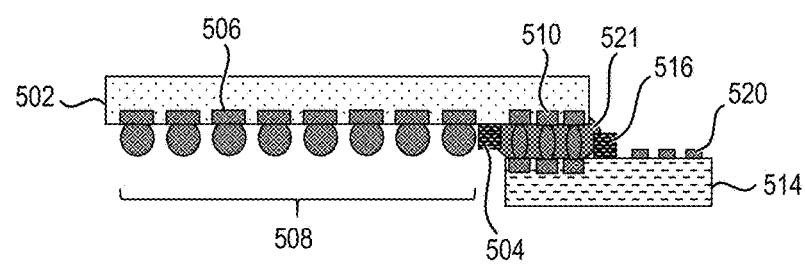
FIGS. 5B through 5F are cross-sectional views depicting intermediate processing steps in an overall semiconductor fabrication methodology for forming an exemplary bridge chip assembly structure adapted for use with an underfill paste, according to one or more embodiments of the present invention.

FIGS. 5B through 5F are cross-sectional views depicting intermediate processing steps in an overall semiconductor fabrication methodology for forming an exemplary bridge chip assembly structure adapted for use with an underfill paste, according to one or more embodiments of the invention. With reference to FIG. 5B, the bridge chip 514 is shown bonded with the first IC die 502. In this step, the bridge chip 514 is flipped upside-down relative to the first IC die 502, so that the first plurality of fine pitch connection pads 518 on the bridge chip is aligned with the corresponding fine pitch connections (e.g., solder microbumps) 510 on the first IC die. A non-conductive underfill paste 519 deposited on the upper surface of the first IC die 502 and/or the bridge chip 514 will extrude out from the area of the fine pitch connections during the process of bonding the bridge chip with the first IC die, but will be constrained by the dams 504 and 516 formed on the first IC die and the bridge chip, respectively. In this manner, the underfill material is prevented from flowing into the coarse pitch connection region 508 of the first IC die or onto the fine pitch connections pads 520 on the opposing end of the bridge chip.

Figure 5C:
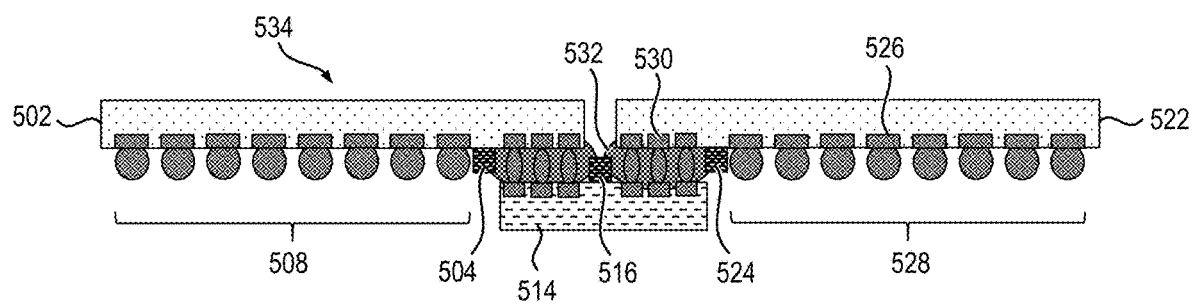

Similarly, FIG. 5C depicts the bridge chip 514 bonded with a second IC die 522. The second IC die 522, like the first IC die 502, includes a dam or barrier 524 formed on an upper surface thereof which separates a plurality of larger coarse pitch connections (e.g., C4 solder bumps) 526 formed in a coarse pitch connection region 528 of the second IC die, from a plurality of smaller fine pitch connections (e.g., solder microbumps) 530. In this step, the fine pitch connections 530 on the second IC die 522 are aligned with the corresponding second set of fine pitch connection pads (520 in FIG. 5B) formed on the bridge chip 514. A non-conductive underfill paste 532 deposited on the upper surface of the second IC die 522 and/or the bridge chip 514 will extrude out from the area of the fine pitch connections during the process of bonding the bridge chip with the second IC die, but will be constrained by the dams 524 and 516 formed on the second IC die and the bridge chip, respectively. In this manner, the underfill material is prevented from flowing into the coarse pitch connection region 528 of the second IC die. At this point in the fabrication process, since the first set of fine pitch connections (510 in FIG. 5B) are already covered by underfill material, the dam structure 516 formed on the bridge chip 514 is essentially unnecessary. It is to be appreciated that the first and second IC dies may, in one or more embodiments, be bonded with the bridge chip 514 either sequentially, as shown in FIGS. 5B-5C, or concurrently. After bonding the first and second IC dies 502, 522 to the bridge chip 514, the dams 504, 516, 524 may be removed if desired, such as by a standard etching process, resulting in the overall bridge chip assembly 534.

Figure 5D:
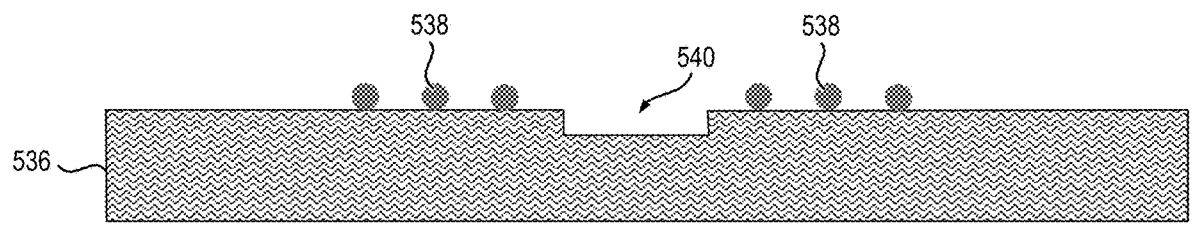

FIG. 5D depicts an organic laminate or substrate 536 which is to be bonded with the bridge chip assembly (534 in FIG. 5C). Optionally, a tacky material 538 is dispensed on at least a portion of an upper surface of the organic laminate 536, such as by using a standard deposition process. The tacky material 538, which may comprise essentially any material(s) having adhesive properties, serves to stabilize and temporarily secure the bridge chip assembly to the organic laminate 536 during the bonding process. In this illustrative embodiment, the organic laminate 536 includes a cavity or other recess 540 formed partially through the upper surface thereof that is configured to receive the bridge chip (514 in FIG. 5C). As previously explained, this recess 540 enables the solder bump connections (506 and 526 in FIGS. 5B and 5C, respectively) formed on the first and second IC dies 502, 522 to be substantially planar with and electrically contact corresponding pads (not explicitly shown, but implied) formed on the upper surface of the organic laminate 536.

Figure 5E:
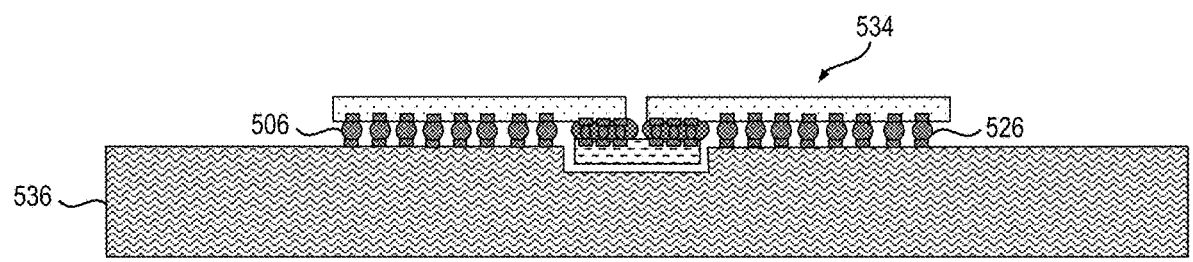

In FIG. 5E, the bridge assembly 534 is placed for bonding with the organic laminate 536, such that the bridge chip 514 is disposed within the recess (540 in FIG. 5D) and the coarse pitch connections 506, 526 are aligned with the corresponding connection pads (not explicitly shown) formed on the upper surface of the organic laminate. In one or more embodiments, a formic acid reflow process is employed to bond the bridge chip assembly 534 to the organic laminate 536. A formic acid reflow process is a suitable alternative to flux-free soldering using lower temperatures to perform the solder reflow under a formic acid (HCOOH) vapor. The vapor chemically reacts with the metal oxides of the solder connections at a lower temperature (150-160° C.) to create formats; increasing the temperature decomposes the formats into hydrogen, water and carbon dioxide. Formic acid, which can provide efficient reduction for most solders, is widely used in fluxless soldering.

Figure 5F:
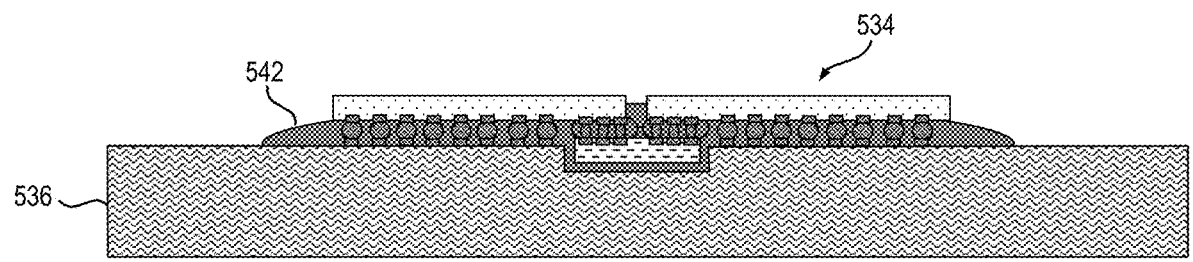

With reference to FIG. 5F, once the bridge chip assembly 534 is bonded to the organic laminate 536, a capillary underfill material 542 is injected across the assembly to fill spaces between the assembly and the organic laminate. The underfill material 542 provides additional support for increasing the structural integrity of the resulting bonded device.

Figure 6:
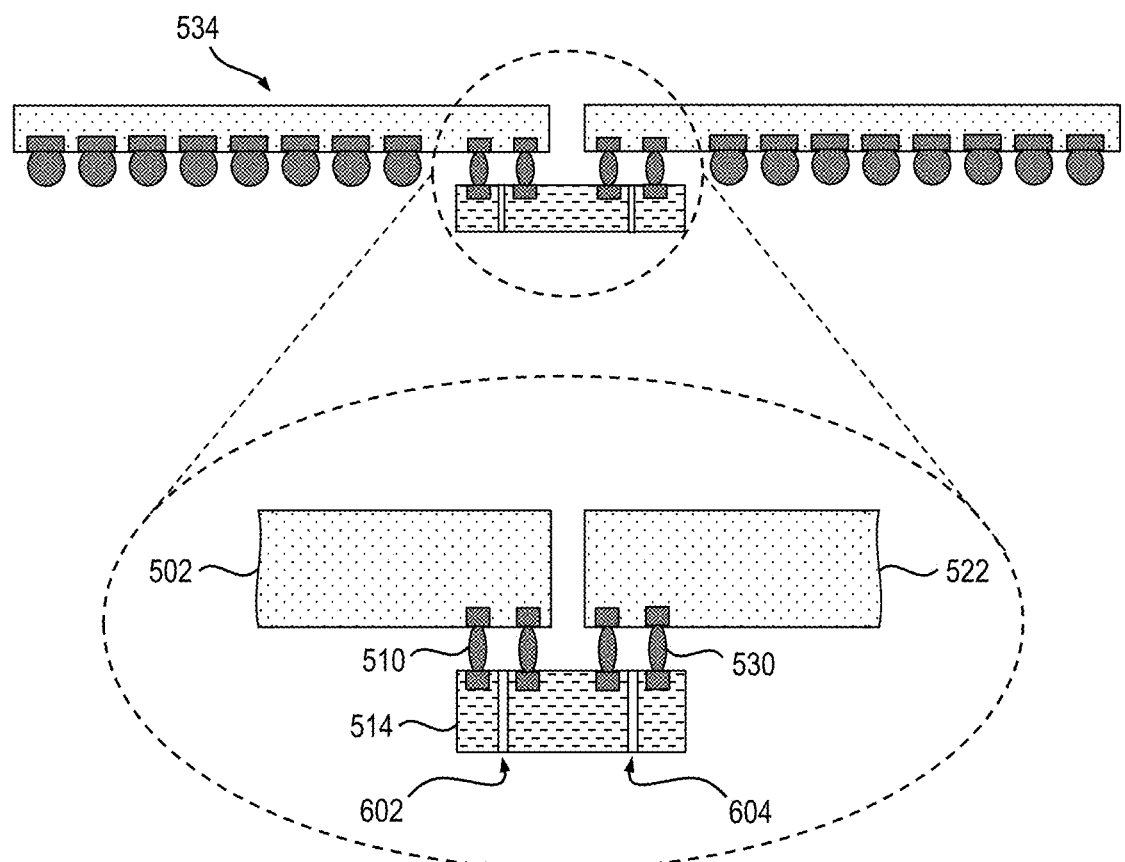
FIG. 6 is a cross-sectional view depicting an exemplary process for introducing non-conductive underfill material between a bridge chip and one or more IC dies to which the bridge chip is joined, according to an embodiment of the present invention.

FIG. 6 is a cross-sectional view depicting an exemplary structure which facilitates the introduction of non-conductive underfill material between a bridge chip and one or more IC dies to which the bridge chip is joined, post-fabrication of the bridge chip assembly, according to an alternative embodiment of the invention. The process shown in FIG. 6 includes forming one or more openings (i.e., holes), 602 and 604, through the bridge chip 514. The holes 602, 604 may be formed, for example, by laser drilling or deep reactive ion etching (RIE), prior to dicing the bridge chip 514 from the overall wafer. In one or more embodiments, at least one hole is provided for each set of fine pitch connections on the bridge chip. In the illustration shown in FIG. 6, a first hole 602 is created in the bridge chip 514 proximate an area of the first set of fine pitch connections 510, and a second hole 604 is created proximate an area of the second set of fine pitch connections 530. More than one hole may be formed through the bridge chip for each set of fine pitch connections. The underfill material is dispensed through the hole after bonding the bridge chip 514 to the respective first and second IC dies 502, 522. Introduction of the underfill material in this manner reduces the chance of filler entrapment and/or crack formation which would otherwise impact the structural integrity of the bridge chip assembly.

At least a portion of the structures and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having multiple-die structures formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Reference made throughout this specification to "one embodiment" or "an embodiment" is intended to mean that a particular feature, structure, or characteristic described in connection with the embodiment is included in at least one embodiment of the claimed subject matter. It is to be understood that appearances of the phrase "in one embodiment" or "an embodiment" are not necessarily all referring to the same embodiment. Furthermore, embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it is to be appreciated that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method for fabricating a bridge chip assembly having non-conductive underfill for interconnecting two or more integrated circuit (IC) dies, each of the IC dies having a first region including a first plurality of connections having a first pitch associated therewith and having a second region including a second plurality of connections or connection pads having a second pitch associated therewith, the first pitch being greater than the second pitch, the method comprising:

attaching a non-conductive underfill film on an upper surface of at least the second region of each of the IC dies;

bonding a first one of the IC dies to a bridge chip using the second plurality of connections or connection pads thereof, the bridge chip comprising at least a first plurality of connection pads or connections having the second pitch associated therewith, the first plurality of connection pads or connections of the bridge chip being aligned with the corresponding second plurality of connections or connection pads of the first one of the IC dies; and bonding a second one of the IC dies to the bridge chip using the second plurality of connections or connection pads thereof, the bridge chip comprising a second plurality of connection pads or connections having the second pitch associated therewith, the second plurality of connection pads or connections of the bridge chip being aligned with the corresponding second plurality of connections or connection pads of the second one of the IC dies;

wherein the bridge chip assembly comprises the bridge chip bonded with at least the first and second IC dies, and the non-conductive underfill film disposed between the bridge chip and the first and second IC dies.

2. The method of claim 1, wherein attaching the non-conductive underfill film on an upper surface of at least the second region of each of the IC dies comprises laminating the underfill film to the upper surface of each of the IC dies in at least the second region of the IC dies.

3. The method of claim 1, wherein a cross-sectional thickness of the non-conductive underfill film is matched to or slightly less than a height of the first plurality of connections above the upper surface of the IC dies.

4. The method of claim 1, further comprising bonding the bridge chip assembly to an organic substrate, the organic substrate being adapted to receive the bridge chip so that the first plurality of connections of each of the IC dies is planar with corresponding connection pads formed on an upper surface of the organic substrate.

5. The method of claim 4, further comprising forming a capillary underfill between the bridge chip assembly and the organic substrate.

6. The method of claim 4, wherein the first plurality of connections of each of the IC dies is formed having a height that is greater than a height of the bridge chip after bonding the bridge chip to the IC dies, so that the bridge chip does not impede bonding of the bridge chip assembly to the organic substrate.

7. The method of claim 1, wherein the non-conductive underfill film is configured to cover the upper surface of each of the IC dies in the first and second regions thereof.

8. The method of claim 1, wherein the non-conductive underfill film is configured to cover the upper surface of each of the IC dies in the second region thereof and is omitted from the first region of each of the IC dies.

9. The method of claim 1, further comprising forming the first plurality of connections of each of the IC dies comprising material having a first melting point, and forming the second plurality of connections of the bridge chip comprising material having a second melting point, the first and second melting points being different.

10. The method of claim 9, wherein the first melting point is lower than the second melting point, such that the second plurality of connections joining the bridge chip to the IC dies will not melt during bonding of the bridge chip assembly to an organic substrate.

11. The method of claim 9, wherein the first melting point is higher than the second melting point, such that the first plurality of connections, adapted to bond the bridge chip assembly to an organic substrate, will not melt during joining of the bridge chip to the IC dies.

12. The method of claim 1, further comprising forming at least one dam on an upper surface of at least one of the bridge chip and one or more of the IC dies, the dam being configured to restrict a flow of underfill material to only prescribed areas of the IC dies and/or the bridge chip, thereby preventing the underfill material from flowing onto unintended surfaces of the IC dies and/or the bridge chip during bonding of the bridge chip to the IC dies.

13. A bridge chip assembly structure, comprising:
 at least first and second integrated circuit (IC) dies, each of the IC dies comprising a first plurality of connections having a first pitch associated therewith formed on an upper surface thereof, the first plurality of connections comprising material having a first melting point and being adapted for bonding the bridge chip assembly structure with an organic substrate; and
 a bridge chip comprising a second plurality of connections having a second pitch associated therewith formed on an upper surface thereof, the first pitch being greater than the second pitch, the second plurality of connections being bonded with corresponding connection pads formed on the respective upper surfaces of the IC dies, the second plurality of connections comprising material having a second melting point, the first and second melting points being different.

14. The bridge chip assembly structure of claim 13, wherein the first melting point is lower than the second melting point, such that the second plurality of connections joining the bridge chip to the IC dies will not melt during bonding of the bridge chip assembly structure to the organic substrate.

15. The bridge chip assembly structure of claim 13, wherein the first melting point is higher than the second melting point, such that the first plurality of connections bonding the bridge chip assembly to the organic substrate will not melt during joining of the bridge chip to the IC dies.

16. The bridge chip assembly structure of claim 13, further at least one dam formed on an upper surface of at least one of the bridge chip and one or more of the IC dies, the dam being configured to restrict a flow of underfill material to only prescribed areas of the IC dies and/or the bridge chip, thereby preventing the underfill material from flowing onto unintended surfaces of the IC dies and/or the bridge chip during bonding of the bridge chip to the IC dies.

17. The bridge chip assembly structure of claim 13, wherein the bridge chip comprises at least one opening formed therethrough, the opening being configured to convey underfill material introduced into the bridge chip assembly structure for filling a space between the bridge chip and the IC dies.

18. A bridge chip assembly structure, comprising:
 at least first and second integrated circuit (IC) dies, each of the IC dies comprising a first plurality of connections having a first pitch associated therewith formed on an upper surface thereof, the first plurality of connections being configured for bonding the bridge chip assembly structure with an organic substrate;
 a bridge chip comprising a second plurality of connections having a second pitch associated therewith formed on an upper surface thereof, the first pitch being greater than the second pitch, the second plurality of connections being bonded with corresponding connection pads formed on the respective upper surfaces of the IC dies, the bridge chip including an opening formed therethrough configured for conveying underfill material; and
 underfill material disposed in an interior space between the bridge chip and the IC dies, the underfill material being conveyed into the interior space through the at least one opening through the bridge chip.

19. The bridge chip assembly structure of claim 18, further at least one dam formed on an upper surface of at least one of the bridge chip and one or more of the IC dies, the dam being configured to restrict a flow of the underfill material to only prescribed areas of the IC dies and/or the bridge chip, thereby preventing the underfill material from flowing onto unintended surfaces of the IC dies and/or the bridge chip during bonding of the bridge chip to the IC dies.

20. A method for fabricating a bridge chip assembly having non-conductive underfill for interconnecting two or more integrated circuit (IC) dies, each of the IC dies having a first region including a plurality of connections having a first pitch associated therewith and having a second region including a plurality of connection pads having a second pitch associated therewith, the first pitch being greater than the second pitch, the method comprising:
 providing a bridge chip comprising at least first and second pluralities of connections having the second pitch associated therewith;
 attaching a non-conductive underfill film on an upper surface of the bridge chip and covering the first and second pluralities of connections;
 bonding a first one of the IC dies to the bridge chip using the plurality of connections pads thereof, the first plurality of connections of the bridge chip being aligned with the corresponding plurality of connection pads of the first one of the IC dies; and
 bonding a second one of the IC dies to the bridge chip using the plurality of connection pads thereof, the second plurality of connections of the bridge chip being aligned with the corresponding plurality of connection pads of the second one of the IC dies;
 wherein the bridge chip assembly comprises the bridge chip bonded with at least the first and second IC dies, and the non-conductive underfill film disposed between the bridge chip and the first and second IC dies.

* * * * *